United States Patent [19]

Nakamura

[11] Patent Number: 5,413,986
[45] Date of Patent: May 9, 1995

[54] METHOD FOR PRODUCTION OF THIN OXIDE SUPERCONDUCTING FILM AND SUBSTRATE FOR PRODUCTION OF THE FILM

[75] Inventor: Kozo Nakamura, Hiratsuka, Japan

[73] Assignee: Kabushiki Kaisha Komatsu Seisakusho, Tokyo, Japan

[21] Appl. No.: 691,057

[22] PCT Filed: Dec. 25, 1989

[86] PCT No.: PCT/JP89/01299

§ 371 Date: Jun. 21, 1991

§ 102(e) Date: Jun. 21, 1991

[87] PCT Pub. No.: WO90/07591

PCT Pub. Date: Jul. 12, 1990

[30] Foreign Application Priority Data

Dec. 23, 1988 [JP] Japan ................ 63-323739

[51] Int. Cl.$^6$ .................................................. C30B 25/18
[52] U.S. Cl. ................................... 505/476; 505/447; 505/238; 505/473; 505/451
[58] Field of Search ............... 156/600, 610, 613, 614; 505/1, 729, 730, 238, 239, 330, 447, 973; 117/90, 89, 95, 105

[56] References Cited

U.S. PATENT DOCUMENTS

| | | | |
|---|---|---|---|
| 4,996,187 | 2/1991 | Chai | 505/1 |
| 5,173,474 | 11/1993 | Connell et al. | 505/729 |

FOREIGN PATENT DOCUMENTS

| | | |
|---|---|---|
| 50-134200 | 10/1975 | Japan. |
| 63-260896 | 10/1988 | Japan. |
| 2267119 | 10/1990 | Japan ................ 505/729 |
| 4-2697 | 1/1992 | Japan ................ 505/729 |
| WO904857 | 5/1990 | WIPO. |

OTHER PUBLICATIONS

Moriwaki et al., "Electrical Properties of Superconducting (LaSr) CuOg And BaYCuO Thin Films," High Temperature Superconductors Ext. abs, MRS Apr. 1987, pp. 85–87.

*Japanese Journal of Applied Physics*, vol. 27, No. 7, pp. L1293–L1296, "Formation of Bi–Sr–Ca–Cu–O Thin Films by a Laser Sputtering Method", Masaki Kanai et al., Jul. 1988.

*Primary Examiner*—Robert Kunemund
*Attorney, Agent, or Firm*—Armstrong, Westerman, Hattori, McLeland & Naughton

[57] ABSTRACT

A method for producing a thin oxide superconducting film possessing high crystallinity and excellent quality and a novel single crystal as a substrate allowing easy formation of an epitaxial film of high quality usable for the method are provided. The method for the production of the thin oxide superconducting film is characterized by using as a substrate a single crystal of SrLaGaO$_4$ which is a high-melting oxide and effecting epitaxial growth of a thin oxide superconducting film on the substrate. The single crystal used as a substrate is an oxide single crystal possessing a crystal structure of the K$_2$NiF$_4$ type and having a composition of Sr$_{1-X}$La$_{1-Y}$Ga$_{1-Z}$O$_{4-W}$ (wherein X, Y, Z, and W fall in the following respective ranges; $-0.1 < X < 0.1$, $-0.1 < Y < 0.1$, $-0.1 < Z < 0.1$, and $-0.4 < W < 0.4$).

2 Claims, No Drawings

METHOD FOR PRODUCTION OF THIN OXIDE SUPERCONDUCTING FILM AND SUBSTRATE FOR PRODUCTION OF THE FILM

FIELD OF THE INVENTION

This invention relates to a method for the production of a thin oxide superconducting film and to a Sr—La—Ga type oxide single crystal usable advantageously as a substrate for the production mentioned above.

BACKGROUND OF THE INVENTION

The electronic devices utilizing the phenomenon of superconduction find extensive utility in various applications as high-speed switches, high-sensitivity detectors, and high-sensitivity fluxmeters.

These superconducting devices are constructed with thin superconducting films. Since the thin superconducting films have considerably low critical superconducting temperatures (Tc) and, therefore, require use of liquefied helium as a cooling agent, they have encountered the problem of high cost, complexity of overall system, and incapability of size reduction.

Thus, studies have been promoted on thin oxide superconducting films possessing high critical superconducting temperatures. Thin oxide superconducting films discovered in recent years have critical superconducting temperatures exceeding 77° K. and, therefore, are capable of being operated by the use of inexpensive liquefied nitrogen as a cooling agent.

For the production of thin oxide films of this class, the method which comprises superposing a given thin film by the spattering method or the vacuum evaporation method on a MgO single-crystal substrate or a $SrTiO_3$ single-crystal substrate heated in advance to an elevated temperature has been used. It has been proposed in recent years for the purpose of enhancing the epitaxial growth of a thin oxide film to use as a substrate therefor an oxide insulator possessing a lattice-matching property relative to a given oxide superconductor and, at the same time, containing at least one of the component elements of the superconductor (Japanese Patent Application Disclosure SHO 63(1988)-236,794).

The conventional method for the production of a thin film by the use of a MgO single crystal or a $SrTiO_3$ single crystal as a substrate does not easily produce an epitaxial film of high quality. This fact has posed itself a serious problem for the stabilization of critical superconducting temperature (Tc) and for the improvement and stabilization of the critical superconducting current (Jc).

To allow the growth of an excellent epitaxial film, the material for the substrate must fulfil the following requirements, for example:

(i) It should exhibit a highly satisfactory lattice-matching property to a thin crystal film.
(ii) It should avoid deteriorating film quality due to mutual diffusion of the film and the substrate during the epitaxial growth of the film.
(iii) It should possess a high melting point exceeding at least 1,000° C. to withstand the heating at an elevated temperature.
(iv) It should be procurable in the form of a single crystal possessing highly satisfactory crystallinity.
(v) It should be an insulator of electricity.

Incidentally, numerous oxides such as those of the $InBa_2Cu_2O_{7-\delta}$ ($\delta = 0$ to 1, Ln=Yb, Er, Y, Ho, or Gd) type, the Bi—Sr—Ca—Cu—O type, and the Tl—Ba—Ca—Cu—O type, for example, have been reported as high-temperature oxide superconductors. The lattice constants, a and b, of these oxide superconductors are invariably in the range of 3.76 to 3.92 Å.

Since they assume a face-centered configuration, the magnitudes $\sqrt{2}a$ and $\sqrt{2}b$ may well be regarded as representing the basic lattices. In this case, the lattice constants, a and b, are expressed as 5.32 to 5.54 Å.

In contrast, MgO which is a material now in widespread use for substrates has a lattice constant, a=4.203 Å, and a lattice mismatch ratio as high as to reach a range of 7 to 11%. Thus, it allows production of an epitaxial film of good quality only with difficulty.

$SrTiO_2$ possesses a small lattice mismatch ratio in the range of 0.4 to 4% and exhibits an excellent lattice-matching property. The $SrTiO_3$ single crystal, however, is produced at present solely by the Bernoulli method. The crystal obtained by this method exhibits very poor crystallinity and possesses an etch pit density exceeding $10^4$ pits/cm$^2$. It allows production of an epitaxial film of high quality only with difficulty. Further, substrates of an appreciably large size are not procurable.

SUMMARY OF THE INVENTION

This invention, produced in the urge to eliminate the drawbacks of the prior art described above, aims to provide a novel single-crystal substrate material capable of readily forming an epitaxial film of good quality.

Another object of this invention is to provide a method capable of producing a thin oxide superconducting film excelling in crystal-linity and possessing high quality.

To accomplish the objects described above in accordance with the first aspect of the present invention, there is provided a Sr—La—Ga type oxide single crystal possessing a crystal structure of the $K_2NiF_4$ type and having a composition of $Sr_{1-X}La_{1-Y}Ga_{1-Z}O_{4-W}$ ($-0.1<X<0.1$, $-0.1<Y<0.1$, $-0.1<Z<0.1$, $-0.4<W<0.4$), and befitting a substrate material.

Then, according to the second aspect of the present invention, there is provided a method for the production of a thin oxide superconduting film, characterized by using as a substrate the aforementioned $SrLaGaO_4$ single crystal which is a high-melting oxide possessing a lattice constant closely approximating that of a pertinent oxide superconductor and effecting epitaxial growth of a thin oxide superconducting film on the substrate.

As described above, the $SrLaGaO_4$ single crystal according with the present invention is an oxide insulator which possesses a lattice constant falling in the range in which the lattice constants of oxide superconductors possessing high critical superconducting temperatures fall, also possesses a crystal structure closely approximating those of the oxide superconductors, and exhibits a highly satisfactory lattice-matching property. In accordance with this invention, therefore, a thin superconducting oxide film possessing high magnitudes of Tc and Jc can be produced because epitaxial growth of a thin oxide superconducting film can be attained by using as a substrate therefor the aforementioned $SrLaGaO_4$ single crystal.

These and other objects, aspects, and advantages of the present invention will become apparent to persons skilled in the art as the disclosure is made in the following description of preferred embodiments cited as examples conforming to the principle of this invention.

DETAILED DESCRIPTION OF THE INVENTION

The high-temperature oxide superconductors reported to date have lattice constants, a and b, in the range of 3.76 to 3.92 Å as already mentioned. The present inventor has continued a study in search of a substrate grade single crystal possessing a lattice constant of 3.85 Å, a mean value of the range just mentioned. He has consequently found that in the various crystals possessing the lattice constant, a=3.85 Å, SrLaGaO$_4$ can constitute itself an outstanding material for a substrate.

It has been reported by G. Blasse (J. Inorg. Nucl. Chem., (1965), Vol. 27, pp. 2683-2684) that SrLaGaO$_4$ assumes a K$_2$NiF$_4$ type structure and possesses a lattice constant, a=3.84 Å. What was produced by G. Blasse was a sintered mass and not a single crystal. K. Aso produced a sintered mass of SrKaGaO$_4$ and tested it to determine its lattice constant (J. Phys. Soc. Jpn., (1978), Vol. 44, No. 4, pp. 1083 to 1090). These two reports are the only information published so far concerning the compound SrLaGaO$_4$. The products covered thereby are invariably sintered masses and not single crystals. For use as a substrate intended for the production of an epitaxially grown film, a sintered mass which is a polycrystal is undesirable. The substrate should be a single crystal. Neither the feasibility of the production of a single crystal of SrLaGaO$_4$ nor the melting point of this oxide is reported anywhere in the literature published to date.

The present inventor, therefore, conducted a study on the transformation of SrLaGaO$_4$ into a single crystal and tried the production of the single crystal by the crucible cooling method. As regards synthesis of a raw material, a sintered mass of SrLaGaO$_4$ was obtained by mixing SrCO$_3$, La$_2$O$_3$, and Ga$_2$O$_3$ in a molar ratio of 2:1:1 calcining the resultant mixed powder at 1,200° C. pulverizing and then pressing the calcined powder, and sintering the pressed mass of the powder. This sintered mass was placed in a platinum crucible, heated to a level exceeding the melting point, and then gradually cooled at a rate of 1° C./min. As the result, a large planar single crystal measuring the square of 5 to 15 mm and having the plate surface as a C plane was easily obtained. This single crystal had a melting point of about 1,520° C., indicating that it was a sufficiently high-melting crystal.

The composition capable of forming a single crystal was confirmed to be in the following range: $Sr_{1-X}La_{1-Y}Ga_{1-Z}O_{4-W}$ wherein $-0.1 < X < 0.1$, $-0.1 < Y < 0.1$, $-0.1 < Z < 0.1$, and $-0.4 < W < 0.4$.

The inventor tried the production of the single crystal by the Czokralsky method. Specifically, a single crystal of a [001] axis measuring 25 mm in diameter and 100 mm in length was obtained in a 1 vol % O$_2$—N$_2$ atmosphere at a pulling speed in the range of 2 to 6 mm/hr and a crystal revolution umber in the range of 10 to 60 rpm.

The single crystal of SrLaGaO$_4$ can be produced by the crucible cooling method and the Czokralski method as described above. Otherwise, it may be produced by the zone melting method and the Bridgman method as well.

The single crystal of SrLaGaO$_4$ has a lattice constant, a=3.84 Å. Since it is a face-centered tetragonal crystal, it may be regarded as having $\sqrt{2}a$ as a basic lattice and, therefore, possessing a lattice constant, a=5.43 Å. Since the lattice constants, a and b, of the oxide superconductors fall in the range of 3.76 to 3.92 Å or in the range of 5.32 to 5.54 Å as described above, their lattice mismatch ratios relative to the SrLaGaO$_4$ are invariably so small as to fall within ±2%. The single crystal possesses a crystal structure closely approximating those of the oxide superconductors and exhibits an outstanding lattice-matching property.

As the result, by using a substrate of SrLaGaO$_4$ and superposing thereon by epitaxial growth a thin oxide superconducting film by the sputtering method, the vacuum evaporation method, etc., a thin oxide superconducting film possessing highly satisfactory crystallinity can be easily obtained.

EXAMPLES

Now, the present invention will be described more specifically below with reference to working examples. Of course, this invention is not limited to these examples.

EXAMPLE 1

This example concerns production of a Sr—La—Ga type oxide single crystal.

To obtain a single crystal of the composition of SrLaGaO$_4$, 678.3 g of La$_2$O$_3$ (purity 99.99%), 614.7 g of SrCO$_3$ (purity 99.999%), and 390.2 g of Ga$_2$O$_3$ (purity 99.999%) were mixed and the resultant mixture was calcined at 1,200° C. for decarbonation, then pulverized, and press molded. A sintered mass of SrLaGaO$_4$ weighing approximately 1,500 g was obtained by sintering the molded mass in the open air at 1,300° C.

This sintered mass was placed in an iridium crucible measuring 800 mm in outside diameter, 80 mm in height, and 2 mm in wall thickness and then liquefied by high-frequency heating therein. A nitrogen atmosphere containing 0.5 to 2% of oxygen was used to envelope the site of the heat treatment. Since vaporization of a small portion of the gallium oxide occurred under a nitrogen atmosphere containing no oxygen, the addition of oxygen in the amount indicated above was found to be desirable.

After the content of the crucible was fused, a seed crystal was immersed in the melt and processed in accordance with the Czokralski method to induce growth of a single crystal of SrLaGaO$_4$.

Initially, a [100] single crystal of SrTiO$_3$ was used as the seed crystal. After the single crystal of SrLaGaO$_4$ was obtained, the single crystal in the [001] orientation of the produced crystal was used as a seed crystal. The crystal was pulled at a pulling rate of 5 mm/hr and a crystal rotating speed of 30 rpm. Under these conditions, a [001] axis single crystal measuring 25 mm in diameter and 100 mm in length was obtained.

It was confirmed that a single crystal of high quality could be produced so long as the composition was in the following range: $Sr_{1-X}La_{1-Y}Ga_{1-Z}O_{4-W}$ wherein $-0.1 < X < 0.1$, $-0.1 < Y < 0.1$, $-0.1 < Z < 0.1$, and $-0.4 < W\ 0.4$.

EXAMPLE 2

A (001) plane single crystal of SrLaGaO$_4$ and a (100) plane single crystal of SrTiO$_3$ for comparison were used. On these substrates, a thin oxide film was superposed in a thickness of 1,000 Å by the RF magnetron spattring using a target of YBa$_2$Cu$_3$O$_{7-\delta}$ under an atmosphere of Ar/O$_2$ (mixing ratio 1:1). The conditions for the spattering were 10 Pa of gas pressure, 300 W of electric power, and 600° C. of substrate temperature. After the superposition, the thin oxide films produced were annealed under an $O_2$ atmosphere at 900° C. for 1 hour.

By the four-terminal method, the produced thin films were tested for zero resistance temperature Tco and critical superconducting current Jc at 77° K. The results are shown in Table 1.

TABLE 1

| Tco and Jc of $YBa_2Cu_3O_{7-\delta}$ | | |
|---|---|---|
| Material of substrate | Tco (K.) | Jc (A/cm$^2$) at 77° K. |
| Conventional method (SrTiO$_3$) | 79 | 0.5 × 10$^4$ |
| This invention (SrLaGaO$_4$) | 84 | 1 × 10$^5$ |

It is clearly noted from the results given above that the product obtained by using the single crystal of SrLaGaO$_4$ as a substrate excelled both in Tco and Jc the product obtained by using the SrTiO$_3$ as a substrate. This fact may be logically explained by a postulate that the film produced with the SrLaGaO$_4$ substrate excelled crystallinity and uniformity and, therefore, enjoyed improvement in Tco and Jc.

When the surfaces of the produced thin films were examined by reflection high-speed electron diffraction (RHEED) as to crystal-linity, it was found that the thin film formed on the SrLaGaO$_4$ substrate showed a sharp spot-like diffraction pattern representing a (001) orientation, indicating that it was a (001) single crystal and produced epitaxial growth.

When thin oxide films were formed each on the (001) plane single crystal as a substrate under the same conditions as described above, excepting LnBa$_2$Cu$_3$O$_{7-\delta}$ (Ln=Yb, Er, Ho, or Gd) was used as a target material, it was found that the produced films invariably produced epitaxial growth.

EXAMPLE 3

A (001) plane single crystal of SrLaGaO$_4$ and a (100) plane single crystal of SrTiO$_3$ for comparison were used. On these substrates, a thin oxide film was superposed in a thickness of 1,000 Å by the RF magnetron spattering using a target of Bi$_4$Sr$_2$Ca$_3$Cu$_4$O under an atmosphere of Ar/O$_2$ (mixing ratio of 2:1). The conditions for the spattering were 5 Pa of gas pressure, 200 W of electric power, and 600° C. of substrate temperature. After the superposition, the thin oxide films produced were annealed under an O$_2$ atmosphere at 900° C. for 1 hour.

By the four-terminal method, the produced thin films were tested for zero resistance temperature Tco and critical superconducting current Jc at 77° C. The results are shown in Table 2.

TABLE 2

| Tco and Jc of thin BiSrCaCuO film | | |
|---|---|---|
| Material of substrate | Tco (K.) | Jc (A/cm$^2$) at 77° K. |
| Conventional method (SrTiO$_3$) | 90 | 1.5 × 10$^4$ |

TABLE 2-continued

| Tco and Jc of thin BiSrCaCuO film | | |
|---|---|---|
| Material of substrate | Tco (K.) | Jc (A/cm$^2$) at 77° K. |
| This invention (SrLaGaO$_4$) | 105 | 2 × 10$^6$ |

It is clearly noted from the results given above that on the SrLaGaO$_4$ substrate, better Tco and Jc were obtained presumably because the film formed thereon excelled in both crystallinity and uniformity.

EXAMPLE 4

A (001) plane single crystal of SrLaGaO$_4$ and a (100) plane single crystal of SrTiO$_3$ for comparison were used. On these substrates, a thin oxide film was superposed in a thickness of 1,000 Å by the RF magnetron spattering using a target of Tl$_2$Ba$_2$Ca$_2$Cu$_3$O$_X$ under an atmosphere of Ar/O$_2$ (mixing ratio 1:1). The conditions for the spattering were 10 Pa of gas pressure, 80 W of electric power, and 600° C. of substrate temperature. After the superposition, the thin oxide films produced were wrapped in gold foil and annealed under an O$_2$ atmosphere at 905° C. for 10 minutes.

By the four-terminal method, the produced films were tested for Tco and Jc at 77° K. The results are shown in Table 3.

TABLE 3

| Tco and Jc of thin TlBaCaCuO film | | |
|---|---|---|
| Material of substrate | Tco (K.) | Jc (A/cm$^2$) at 77° K. |
| Conventional method (SrTiO$_3$) | 92 | 0.5 × 10$^4$ |
| This invention (SrLaGaO$_4$) | 107 | 5 × 10$^5$ |

It is clearly noted from the results given above that, on the SrLaGaO$_4$ substrate, better Tco and Jc were obtained presumably because the film formed thereon excelled in crsytallinity and uniformity.

What is claimed is:

1. A method for the production of a thin oxide superconducting film, comprising providing a substrate of a single crystal comprising Sr$_{1-X}$La$_{1-Y}$Ga$_{1-Z}$O$_{4-W}$, wherein X, Y, Z, and W fall in the following respective ranges: $-0.1<X<0.1$, $-0.1<Y<0.1$, $-0.1<Z<0.1$, $-0.4<W<0.4$ and forming on the substrate by epitaxial growth a thin oxide superconducting film possessing lattice constants a and b in the range of 3.76 to 3.92 Å or in the range of 5.32 to 5.54 Å, wherein said oxide superconducting film comprises an oxide of the Bi—Sr—Ca—Cu—O type.

2. A method for the production of a thin oxide superconducting film, comprising providing a substrate of a single crystal comprising Sr$_{1-X}$La$_{1-Y}$Ga$_{1-Z}$O$_{4-W}$, wherein X, Y, Z, and W fall in the following respective ranges: $-0.1<X<0.1$, $-0.1<Y<0.1$, $-0.1<Z<0.1$, $-0.4<W<0.4$ and forming on the substrate by epitaxial growth a thin oxide superconducting film possessing lattice constants a and b in the range of 3.76 to 3.92 Å or in the range of 5.32 to 5.54 Å, wherein said oxide superconducting film comprises an oxide of the Tl—Ba—Ca—Cu—O type.

* * * * *